US008313962B2

United States Patent
Lott et al.

(10) Patent No.: US 8,313,962 B2
(45) Date of Patent: Nov. 20, 2012

(54) METHOD FOR ATTACHING OPTICAL COMPONENTS ONTO SILICON-BASED INTEGRATED CIRCUITS

(75) Inventors: James A. Lott, Berlin (DE); Nikolai Ledentsov, Berlin (DE); Vitaly Shchukin, Berlin (DE)

(73) Assignee: Connector Optics LLC, St. Petersburg (RU)

( * ) Notice: Subject to any disclaimer, the term of this patent is extended or adjusted under 35 U.S.C. 154(b) by 0 days.

(21) Appl. No.: 12/951,667

(22) Filed: Nov. 22, 2010

(65) Prior Publication Data

US 2011/0165707 A1  Jul. 7, 2011

Related U.S. Application Data

(63) Continuation of application No. PCT/US2009/045041, filed on May 22, 2009.

(60) Provisional application No. 61/055,335, filed on May 22, 2008, provisional application No. 61/055,749, filed on May 23, 2008.

(51) Int. Cl.
*H01L 33/00* (2010.01)
*H01L 31/0232* (2006.01)

(52) U.S. Cl. ..... 438/26; 438/27; 438/458; 257/E33.057; 257/E31.127

(58) Field of Classification Search ............. 438/25–27, 438/106, 458, 464; 257/E33.057, E31.127
See application file for complete search history.

(56) References Cited

U.S. PATENT DOCUMENTS

| | | | | |
|---|---|---|---|---|
| 5,266,794 A | * | 11/1993 | Olbright et al. | 250/214 LS |
| 5,682,062 A | * | 10/1997 | Gaul | 257/686 |
| 6,633,421 B2 | * | 10/2003 | Trezza | 372/26 |
| 6,692,979 B2 | * | 2/2004 | Yeh et al. | 438/27 |
| 6,785,317 B2 | | 8/2004 | Panajotov et al. | |
| 7,180,924 B2 | | 2/2007 | Kondo | |
| 2003/0042501 A1 | * | 3/2003 | Greenwald et al. | 257/189 |
| 2003/0087476 A1 | * | 5/2003 | Oohata et al. | 438/108 |
| 2003/0157783 A1 | * | 8/2003 | Fonash et al. | 438/458 |

(Continued)

OTHER PUBLICATIONS

International Search Report dated Jan. 13, 2010.

*Primary Examiner* — Julio J Maldonado
*Assistant Examiner* — Daniel Shook
(74) *Attorney, Agent, or Firm* — Laurence A. Greenberg; Werner H. Stemer; Ralph E. Locher

(57) ABSTRACT

Hybrid integration of vertical cavity surface emitting lasers (VCSELs) and/or other optical device components with silicon-based integrated circuits. A multitude of individual VCSELs or optical devices are processed on the surface of a compound semiconductor wafer and then transferred to a silicon-based integrated circuit. A specific sacrificial or removable separation layer is employed between the optical components and the mother semiconductor substrate. The transfer of the optical components to a carrier substrate is followed by the elimination of the sacrificial or separation layer and simultaneous removal of the mother substrate. This is followed by the attachment and interconnection of the optical components to the surface of, or embedded within the upper layers of, an integrated circuit, followed by the release of the components from the carrier substrate. It is possible to place and interconnect VCSELs directly within the physical structure of the integrated circuit, thus greatly reducing the power requirements, the distance of interconnecting lines, and the resultant operational speed. A variation allows the selective placement of groups of physically-connected VCSELs, and the collection and placement of large numbers of fabricated VCSELs onto foreign substrates using a vacuum plating tool.

31 Claims, 12 Drawing Sheets

U.S. PATENT DOCUMENTS

| | | | |
|---|---|---|---|
| 2004/0115849 A1* | 6/2004 | Iwafuchi et al. | 438/25 |
| 2005/0208688 A1* | 9/2005 | Otoma et al. | 438/22 |
| 2006/0050755 A1 | 3/2006 | Suzuki et al. | |
| 2006/0263003 A1 | 11/2006 | Assi et al. | |
| 2007/0025408 A1* | 2/2007 | Koelle et al. | 372/50.124 |
| 2008/0219309 A1* | 9/2008 | Hata et al. | 372/44.01 |

* cited by examiner

METHOD FOR ATTACHING OPTICAL COMPONENTS ONTO SILICON-BASED INTEGRATED CIRCUITS

CROSS-REFERENCE TO RELATED APPLICATION

This application is a continuation, under 35 U.S.C. §120, of copending international application No. PCT/US2009/045041, filed May 22, 2009, which designated the United States; this application also claims the priority, under 35 U.S.C. §119(e), of provisional patent applications Nos. 61/055,335, filed May 22, 2008, and 61/055,749, filed May 23, 2008; the prior applications are herewith incorporated by reference in their entirety.

BACKGROUND OF THE INVENTION

Field of the Invention

This invention is related to semiconductor nanometer and micrometer scale electronic and optoelectronic devices, and in particular to a hybrid integration fabrication method for the realization of complete and compact integrated systems composed of silicon-based electrical components that contain embedded compound semiconductor-based optical components. The continuously increasing processing power and bandwidth of silicon-based integrated circuits leads to a critical demand for higher-speed input/output devices to enable extremely fast data exchange rates with memory, peripherals, and other processors. At bit rates at and above 30 Gb/s copper links suffer from signal deterioration and loss already at few centimeter-long distances. A need in optical chip-to-chip interconnects arises. In the future intrachip optical links will also be demanded. As silicon is not an efficient light emitting material, the logical approach is to use microcavity lasers and photodetectors, composed of compound semiconductors, for high-speed optical data transfer. One solution is where the integrated circuit chips and the separately manufactured optoelectronic chips are placed in close proximity and electrically interconnected using metal lines. These metal interconnecting lines have intrinsic performance limitations that are exacerbated as frequency and integrated circuit density increase and special packaging is required, thus necessitating the need for an optical data transfer solution, wherein integrated electrical driver and receiver sub-circuits function in extremely close proximity to their light-emitter and light-detector components. Several methods for the hybrid integration of optoelectronic devices with silicon-based integrated circuits have been known for many years. These methods are essentially equivalent to expensive, slow, and low-yield packaging techniques and thus are not used in practice. A new assembly method is needed that makes use of conventional high-volume wafer-scale manufacturing techniques but that is able to efficiently and accurately combine silicon-based integrated circuits with large numbers of compound semiconductor optical devices.

Integrated circuits (ICs) or chips based on Si and SiGe CMOS and BiCMOS configurations are ubiquitous elements of contemporary life. Modern digital chips contain billions of transistors or memory elements with minimum feature sizes on the order of nanometers, all of which are interconnected by means of metal or short-length and highly doped polysilicon materials. These chips typically employ multiple levels of aluminum or copper-based metal interconnect layers isolated by advanced oxide materials, thus avoiding the tyranny of numbers but functioning by means of the movement of electrons. As the density of transistors and operational (clocking) speed increase, the metal interconnects become the limiting factor in chip functionality, while high volume manufacturing yields to a large extent limit the size of a given chip die and in fact the size of the starting wafer substrate. The metal interconnect problem is greatly exacerbated by the need to interface a given chip to a plurality of other chips or external devices or integrated systems while maintaining the clocking speed.

There are two main techniques to interconnect chips using metal lines of the shortest possible length, namely, wafer-level integration and direct wafer bonding. In wafer-level integration individual chips are placed directly upon a wafer or substrate containing a pre-patterning of metal interconnecting lines using for example a solder-ball bumping or flip-chip process. In direct wafer bonding, individual chips are placed and fused or bonded one against the other, wherein each chip has on its uppermost surface back-end metallization that is aligned and interconnected in specific locations by means of a via metallization level or solder-ball bumps. Both of these aforementioned metal interconnecting techniques have practical limitations: The wafer-level integration technique is limited by high-frequency performance due to the rather long inter-chip metal lines; and the direct wafer bonding technique is limited by the number of dies (generally two chips) that may be interconnected by stacking. In either case, these interconnect techniques rely on electron transport rather the higher speed made possible by way of guided electromagnetic radiation.

Optical interconnects can fill this gap and have been proposed to be used in chip-to-chip interconnects since quite a long time already [1]. The problem, however, is that silicon is not an efficient light emitter. Thus, light emitting devices, such as light emitting diodes or lasers, either directly or indirectly modulated (for example, via electro-refraction or electro-absorption effects in the attached modulator sections) cannot be directly applicable to CMOS and BiCMOS technology. Thus, hybrid integration approaches are applied.

Thus, the chip-to-chip interconnect speed may be greatly enhanced by the use of vertical cavity surface emitting lasers (VCSELs) to send out data via modulated light, and by the use of corresponding photo-detectors to detect the modulated light, so long as the component power requirements remain low. Hybrid integrated circuit-level assembly methods for the realization of optoelectronic circuits and systems composed of VCSELs and photo-detectors combined with for example BiCMOS systems are generally limited by the number of VCSELs that may be placed directly on an underlying integrated circuit. Such methods are difficult to implement in a practical high volume manufacturing process.

Prior art approaches for the integration of VCSELs with foreign substrates or upon integrated circuit chips fall into one of four basic methods:

Lift-off with for example fluidic self-assembly
Direct epitaxial growth (for example on a silicon substrate)
Flip-chip bonding and/or wafer-scale assembly of VCSEL chips
Direct wafer bonding or wafer fusion.

The original lift-off technique applied to VCSELs involved the selective etching of an AlAs sacrificial layer [2] lying between the VCSEL and the substrate upon which the VCSEL had been grown [3]. The result was a large number of individual VCSELs floating freely in solution, wherewith attempts were made using fluidic self-assembly techniques to coax the VCSELs to land, orient, and bond onto specific locations on a foreign substrate. While interesting this approach proved impractical as it is clumsy, difficult to automate, and the assembly yield (percent of VCSEL locations that contain a properly seated VCSEL after assembly) was well below 100 percent.

The sacrificial or separation layer VCSEL lift-off technique has been successfully applied to GaAs-based VCSELs [4, 5, 6]. These studies originated as studies of sacrificial and structural material layers for the development of a III-V micro-electro-mechanical systems (MEMS) technology, wherein VCSEL arrays were placed onto Si-integrated circuits and Si-based MEMS.

The direct growth of AlGaAs/GaAs VCSELs upon a silicon wafer substrate involves the precise growth of crystalline, column III-V (referring to the Periodic Table of the Elements) compound semiconductor layers upon elemental, column IV silicon. The materials AlGaAs/GaAs are lattice-mismatched to silicon by about 4.1 percent and thus it is essentially impossible to grow defect-free VCSELs using this method, although such VCSELs on silicon with rather impractical commercial performance characteristics have been demonstrated [7, 8]. The mismatched epitaxial growth generates threading dislocations which greatly degrade the performance of laser diodes. Recent reports of III-V optical devices grown directly on Ge/SiGe epitaxial layers in-turn lying on a Si substrate, however, are quite promising although to date VCSELs have not been realized with this method. Even if this method is one day successful for VCSELs, it will not be practical as it is not compatible with conventional high volume SiGe BiCMOS IC manufacturing lines.

The flip-chip bonding of VCSELs and VCSEL arrays upon large scale integrated circuits or for example upon pre-patterned substrates designed for optical waveguiding, is a well known and investigated method of integration for the realization of optoelectronic systems [9, 10, 11]. This method utilizes the well established flip-chip bonding and surface mounting methods that have been developed for placing a Si or SiGe ICs, or other device components onto printed circuit boards, foreign substrates, or pre-patterned wafers to facilitate the wafer-scale integration of multiple, independent IC chips. To facilitate the flipping process, the VCSELs are typically bottom-emitting (i.e. through the substrate side—unless the entire substrate is removed by lapping and or chemo-mechanical polishing before or after placement) such that their top surfaces are placed face-down onto the substrate. Top-emitting VCSELs may also be mounted face-down on a foreign substrate if the emitted light is to be directed downward into for example an optical backplane. In practice the flip-chip assembly technique is difficult and impractical to implement for large scale production. Also, since the VCSEL's are directly wired to integrated driver circuits that lie several millimeters away from the VCSELs, the VCSELs are generally limited to modulation rates below 10 Giga-bit per second.

The wafer bonding technique for VCSELs [12, 13, 14] generally involves the direct placement of a wafer containing patterned GaAs-based VCSELs such as in a post geometry sticking up from the surface, up against a foreign wafer for several minutes or hours depending on temperature, along with the concurrent exposure of the wafer pair to heat, pressure, and a forming gas (for example: 30 minutes at 700° C. in hydrogen gas [14]; and 4 hours at 440° C. in hydrogen gas [12]). In a related fusion method the VCSELs' entire substrate can be removed and replaced by a foreign, typically non-absorbing substrate such as quartz, sapphire, or another semiconductor such as InP or GaP. This technique has the same problems as found with flip-chip bonded VCSELs, but with the added complexity of a high temperature and often time-consuming step.

The manufacturing methods herein apply not only to VCSELs but also to other electronic and photonic devices and device structures such as photo-detectors, resonant cavity light-emitting diodes, photodiodes, interference filters, modulators, and many variations and monolithic combinations of these device structures.

This description is directed to a specific VCSEL and EOM VCSEL designed to emit light near 850 nanometers or at any other wavelength of interest so as to specifically describe an example of the novel hybrid integration scheme. Those of skill in the art, however, with readily understand that the manufacturing method applies equally well to other VCSELs composed of other material combinations and designed to emit light at other peak emission wavelengths from the infrared through the visible through the ultra-violet.

SUMMARY OF THE INVENTION

Methods and assembly techniques are described that facilitate the realization of hybrid integrated optoelectronic circuits containing: 1) combinations of silicon or silicon-germanium-based large scale integrated circuits for computing; 2) integrated optical waveguides, channels, backplanes, and many other photonic components for the routing and distribution of light signals and intra- and inter-chip information transfer; and 3) active and passive optoelectronic devices such as for example: interference filters, modulators, two terminal vertical cavity surface emitting laser (VCSEL) diodes, or three-terminal very high speed electro-optically modulated vertical cavity surface emitting lasers (EOM VCSELs). Exemplary VCSELs consist of a plurality of epitaxially-grown layers including a sacrificial separation layer between the mother substrate and the as-grown device structures. This layer facilitates the lift-off of a massive number of VCSEL disks from the mother substrate for subsequent placement upon and/or bonding with and/or electrical interconnecting to a foreign substrate or various other media such as a completely fabricated integrated circuit, a photonic integrated circuit, and optical backplane, or upon other optoelectronic device structures. The top or bottom-emitting VCSELs may be integrated with and embedded within the back-end metal interconnecting layers of integrated silicon-germanium driver circuits, wherein high frequency VCSEL modulation is facilitated by means of extremely short interconnecting lines.

Focusing at automated processes of the integration of optical components with the ICs, optical components, a method is disclosed, wherein the optical components from an initial wafer are transferred onto an IC. Typically, the density of the optical components on an initial wafer is larger than the density of port position on a target IC wafer. A method disclosed includes using a selectively prepatterned wafer containing voids of different depth, or pedestals of different height providing selective transfer of optical devices onto a silicon-based wafer. In another embodiment of the present invention, the optical devices are transferred from the mother wafer first selectively on an intermediate, carrier wafer, and then, non-selectively, on the final silicon-based wafer.

Other features which are considered as characteristic for the invention are set forth in the appended claims.

Although the invention is illustrated and described herein as embodied in a method for attaching optical components onto silicon-based integrated circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 14(a) Stacking of a wafer with a dense array of optical components onto a wafer with selectively pre-patterned dense array of voids.

FIG. 14(b) Schematic view of the selective attachment process.

FIG. 14(c) A wafer with a locally attached optical component.

DETAILED DESCRIPTION OF THE INVENTION

Embodiments of wafer separated individual disks and disk arrays of vertical cavity surface emitting lasers (VCSELs), electro-optically modulated vertical cavity surface emitting lasers (EOM VCSELs), and/or photo-detectors (PDs) and methods or the placement or assembly of said devices onto or with silicon-germanium (SiGe) integrated circuits are described herein. In the following description numerous specific details are set forth to provide a thorough understanding of the embodiments. Those skilled in the pertinent art know and will appreciate, however, that the techniques described herein can be practiced without one or more of the specific details, or with other methods, components, materials, layer sequences, etc. In other instances, well-known structures, materials, methods, or operations are not shown or described in detail to avoid obscuring certain aspects.

Reference throughout this specification to one embodiment or an embodiment means that a particular feature, structure, or characteristic described in connection with the embodiment is included in at least one embodiment of the present invention. Thus, the appearances of the phrases in one embodiment or in an embodiment in various places throughout this specification are not necessarily all referring to the same embodiment. Furthermore, the particular features, structures, or characteristics may be combined in any suitable manner in one or more embodiments.

Figure 1:
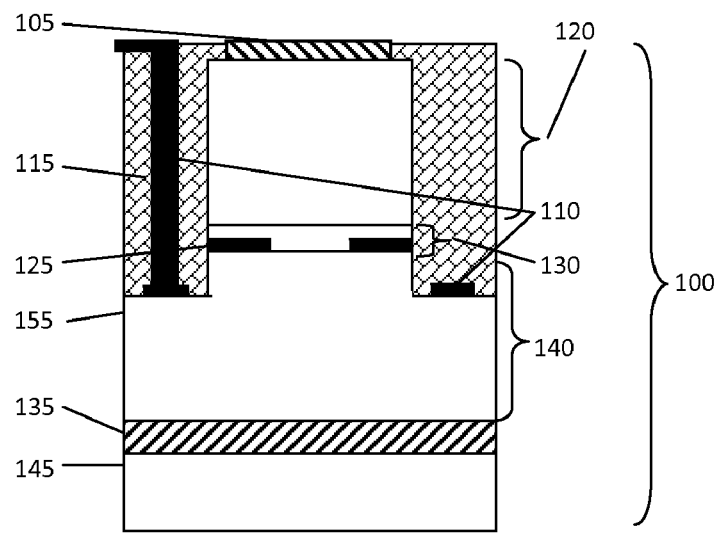
FIG. 1 is a cross-sectional view of a bottom-emitting vertical cavity surface emitting laser containing a sacrificial separation layer, in accordance with an embodiment of the invention.

Referring now more specifically to the drawings, FIG. 1 is a cross-sectional perspective of a bottom-emitting VCSEL (100) containing a sacrificial separation layer (135), in accordance with an embodiment of the invention. The illustrated embodiment includes a mother wafer, which is, for the illustrated embodiment, GaAs substrate (145), upon which is grown a bottom distributed Bragg reflector (DBR) (140) consisting of a plurality of AlGaAs layers and a top DBR (120) consisting of a plurality of AlGaAs layers, wherein the DBRs surround a microcavity active region (130) that contains an AlAs or AlGaAs layer that is selectively oxidized (125) to form an Al-oxide or AlGa-oxide current blocking and waveguiding aperture. In the illustrated embodiment of FIG. 1 the VCSEL includes two metal contacts (105) and (110) that are made planar on the top surface by using a planarizing material (115) such as a polyimide, and an optional etch stop layer (155) for precisely stopping a mesa etching step on a particular material layer within the VCSEL (100).

In one embodiment the sacrificial separation layer (135) consists of AlAs or AlGaAs as in layer (125) and may or may not be thicker than layer (125) and may or may not have a larger AlAs mole fraction content than layer (125).

In one embodiment the sacrificial separation layer (135) consists of InGaAs, InGaP, AlGaP, AlGaInP, or another material.

In one embodiment the sacrificial separation layer (135) is used as an etching stop layer, wherein first the substrate is removed by mechanical lapping and/or chemical etching with an etchant that does not appreciably etch the layer (135). This substrate etching is followed by a selective removal of layer (135) using an etchant that selectively etches layer (135) but not the adjoining DBR layers (140).

Figure 2:
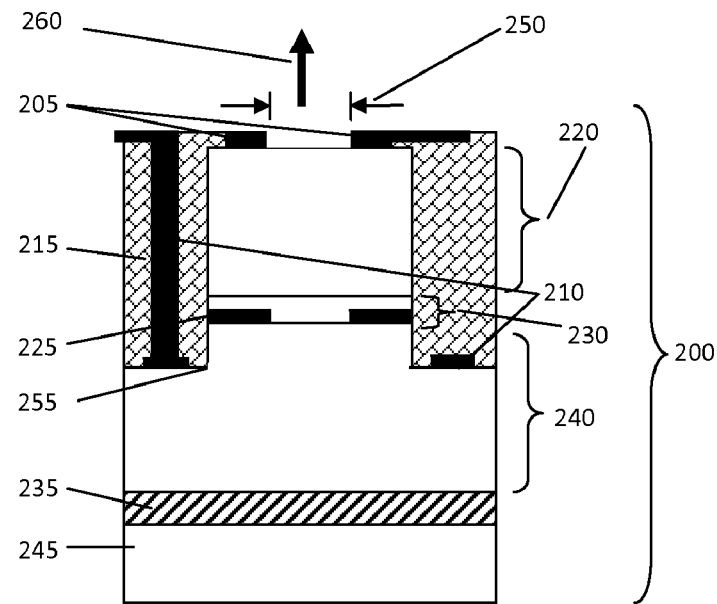
FIG. 2 is a cross-sectional view of a top-emitting vertical cavity surface emitting laser containing a sacrificial separation layer, in accordance with an embodiment of the invention.

In one embodiment that forms a top-emitting VCSEL (200) as illustrated in FIG. 2 the top metal contact (205) has a ring or annulus geometry and thus is an open aperture in the center wherefrom the VCSEL emits optical radiation in the form of a laser beam upward in the vertical direction (260). Those skilled in the relevant art will recognize that the diameter of the top-metal-contact aperture (250) may or may not correspond to the diameter of the selectively oxidized current-waveguiding aperture (225). Analogous to the VCSEL illustrated in FIG. 1, the VCSEL illustrated in FIG. 2 includes a sacrificial separation layer (235) between the substrate (245) and the bottom DBR (240). Furthermore, analogous to the VCSEL illustrated in FIG. 1, the VCSEL illustrated in FIG. 2 further includes a microcavity (230) that contains an AlAs or AlGaAs layer that is selectively oxidized (225). The microcavity (230) is placed between the bottom DBR (240) and the top DBR (220). In the illustrated embodiment of FIG. 2, the VCSEL includes two metal contacts (205) and (210) that are made planar on the top surface by using a planarization material (215) such as polyimide, and an optional etch stop layer (255) for precisely stopping a mesa etching step on a particular material layer within the VCSEL (200).

Figure 3A:
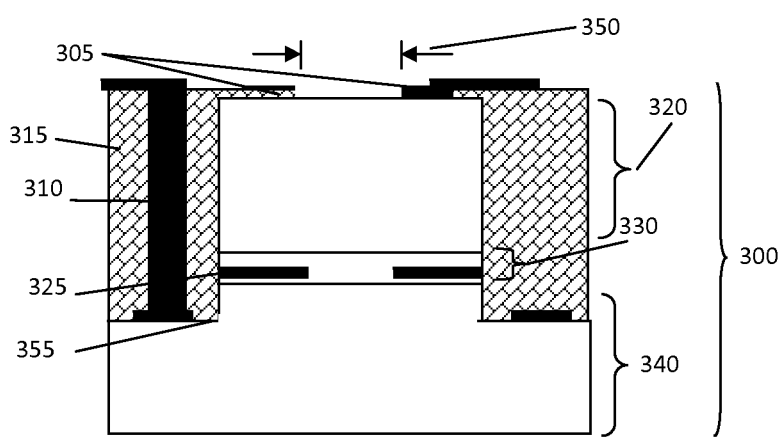
FIGS. 3A and 3B illustrate cross-sectional views of vertical cavity surface emitting lasers after substrate and sacrificial separation layer removal, in accordance with embodiments of the invention.
Figure 3B:
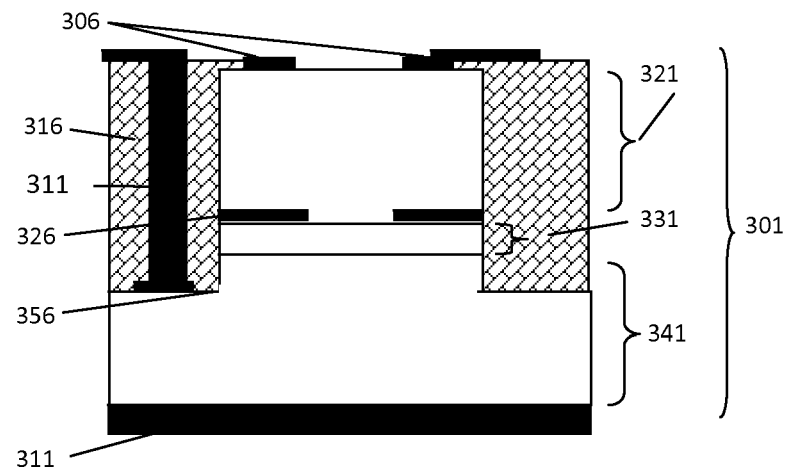

FIGS. 3A and 3B illustrate a cross-sectional view of the VCSEL (200) in FIG. 2, after the substrate (245) and the separation layer (235) have been removed, in accordance with embodiments of the invention. The exemplary embodiment of FIG. 3A the VCSEL (300) includes two ohmic metal contacts (305) and (310) in a ring or annulus geometry on the upper emitting surface of the VCSEL to facilitate direct bonding and electrical connection to a foreign or dummy substrate. The diameter of the top-metal contact aperture (350) may or may not correspond to the diameter of the selectively oxidized current/waveguiding aperture (325). Metal contact (305) is electrically connected to the upper DBR (320), while metal contact (310) is electrically connected to the lower DBR (340). The microcavity (330) is positioned between the lower DBR (340) and the upper DBR (320). The microcavity (330) contains an AlAs or an AlGaAs layer that is selectively oxidized (325). In the illustrated embodiment (300) of the VCSEL, the two metal contacts (305) and (310) are made planar on the top surface by using a planarization material (315) such as polyimide, and an optional etch stop layer (355) for precisely stopping a mesa etching step on a particular material layer within the VCSEL (300).

In the embodiment illustrated in FIG. 3B the VCSEL (301) includes two ohmic metal contacts (306) and (311), where the metal contact (311) is electrically connected to the lower DBR (341) through doping of the semiconductor DBR layers, and resides on the bottom surface of VCSEL (301). The microcavity (331) is positioned between the lower DBR (341) and the upper DBR (321). The microcavity (331) contains an AlAs or an AlGaAs layer that is selectively oxidized (326). In the illustrated embodiment (301) of the VCSEL, the two metal contacts (306) is made planar on the top surface by using a planarization material (316) such as polyimide, and an optional etch stop layer (356) for precisely stopping a mesa etching step on a particular material layer within the VCSEL (301).

Figure 4:
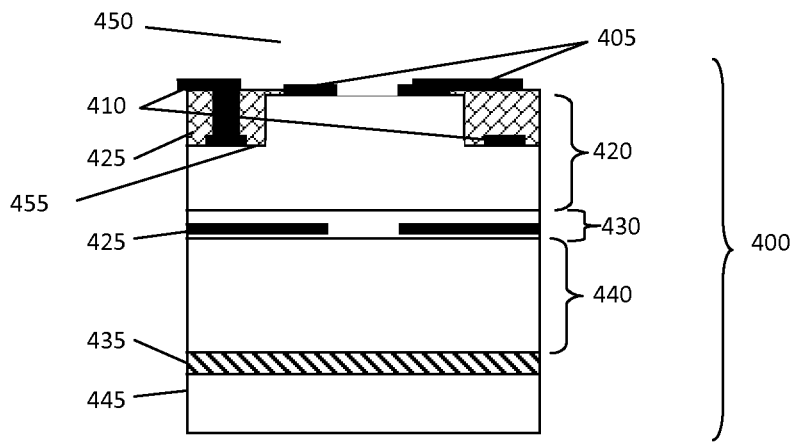
FIG. 4 is a cross-sectional view of an electro-optically modulated vertical cavity surface emitting laser containing a sacrificial separation layer, prior to removal of the sacrificial layer and mother substrate, in accordance with an embodiment of the invention.

FIG. 4 is a cross-sectional view of an EOM VCSEL (400) containing a sacrificial separation layer (435), in accordance with an embodiment of the invention. The illustrated embodiment includes a GaAs substrate (445) upon which is grown a bottom distributed Bragg reflector (DBR) (440) consisting of a plurality of AlGaAs layers and a top DBR (420) consisting of a plurality of AlGaAs layers, wherein the DBRs surround a microcavity active region (430) that contains an AlAs or AlGaAs layer that is selectively oxidized (425) to form an Al-oxide or AlGa-oxide current blocking and waveguiding aperture. In the illustrated embodiment of FIG. 4 the EOM VCSEL includes two metal contacts (405) and (410) across the electro-optic modulator (EOM) structure that are made planar on the top surface by using a planarizing material (415) such as a polyimide, and an etch stop layer (455) for precisely stopping a mesa etching step on a particular material layer within the EOM VCSEL (400). Those skilled in the relevant art will recognize that the diameter of the top metal contact aperture (450) may or may not correspond to the diameter of the selectively oxidized current/waveguiding aperture (425).

In one embodiment the sacrificial separation layer (435) consists of AlAs or AlGaAs as in layer (425) and may or may not be thicker than layer (425) and may or may not have a larger AlAs mole fraction content than layer (425).

In one embodiment the sacrificial separation layer (435) consists of InGaAs, InGaP, AlGaP, AlGaInP, or another material.

In one embodiment the sacrificial separation layer (435) is used as an etching stop layer, wherein first the substrate is removed by mechanical lapping and/or chemical etching with an etchant that does not appreciably etch layer (435). This substrate etching is followed by a selective removal of layer (435) using an etchant that selectively etches layer (435) but not the adjoining DBR layers (440).

Figure 5:
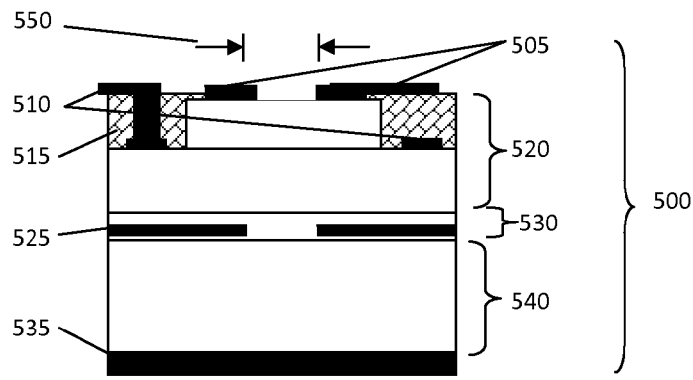
FIG. 5 is a cross-sectional view of an electro-optically modulated vertical cavity surface emitting laser after sacrificial separation layer removal, in accordance with an embodiment of the invention.

In one embodiment as illustrated in FIG. 5 the substrate (445) and the sacrificial layer (435) of the EOM VCSEL (400) illustrated in FIG. 4 are removed and subsequently a metal contacting layer (535) is added to the remaining bottom surface which is now the bottom DBR (540) of the resultant EOM VCSEL (500). The top DBR (520) consists of a plurality of AlGaAs layers, wherein the DBRs surround a microcavity active region (530) that contains an AlAs or AlGaAs layer that is selectively oxidized (525) to form an Al-oxide or AlGa-oxide current blocking and waveguiding aperture. In the illustrated embodiment of FIG. 5 the EOM VCSEL includes two metal contacts (505) and (510) across the EOM structure that are made planar on the top surface by using a planarizing material (515) such as a polyimide. Those skilled in the relevant art will recognize that the diameter of the top metal contact aperture (550) may or may not correspond to the diameter of the selectively oxidized current/waveguiding aperture (525).

The EOM VCSEL (500) or arrays of such EOM VCSELs may be used as a general electro-optic building block, which may be tailored for a variety of electro-optic applications, and which is suited for hybrid assembly with a variety of substrates, integrated circuits, optical backplanes, and many other materials and structures as those skilled in the relevant art will appreciate. This is also true for VCSEL (100), VCSEL (300), VCSEL (301), and the many variations of these structures that are possible. It is also true for a large number of other types of semiconductor devices that may be prepared using separation layers as outlined herein, as those skilled in the relevant art will also appreciate. Such devices include but are not limited to: optical filters, modulators, photodetectors, light-emitting diodes, edge-emitting lasers, MEMS structures, etc.

Figure 6:
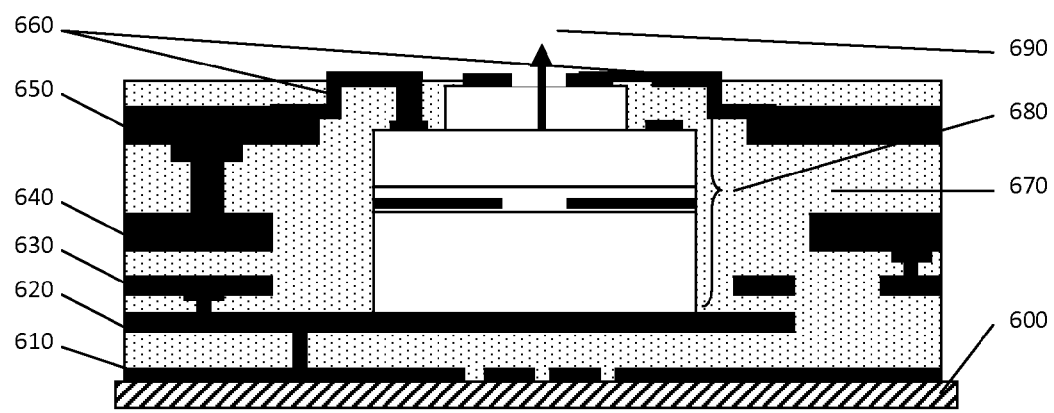
FIG. 6 is a cross-sectional view of an electro-optically modulated vertical cavity surface emitting laser with the mother substrate removed, seated within the metal interconnect layers of an integrated circuit, in accordance with an embodiment of the invention.

In one embodiment as illustrated in FIG. 6 a fabricated EOM VCSEL (680) that is separated from its mother substrate is placed within a five metal-and-oxide-layer back-end metallization section (metal layers 610, 620, 630, 640, and 650) of a SiGe integrated circuit that contains SiGe-based BiCMOS devices (600). These metal layers are separated by isolating oxide layer materials (670). The three-metal terminal EOM VCSEL (680) is bonded and interconnected in place with metal (660) to one or more of the five back-end metallization layers. In this embodiment the EOM VCSEL emits light (690) directed upward away from the underlying integrated circuit.

Figure 7:
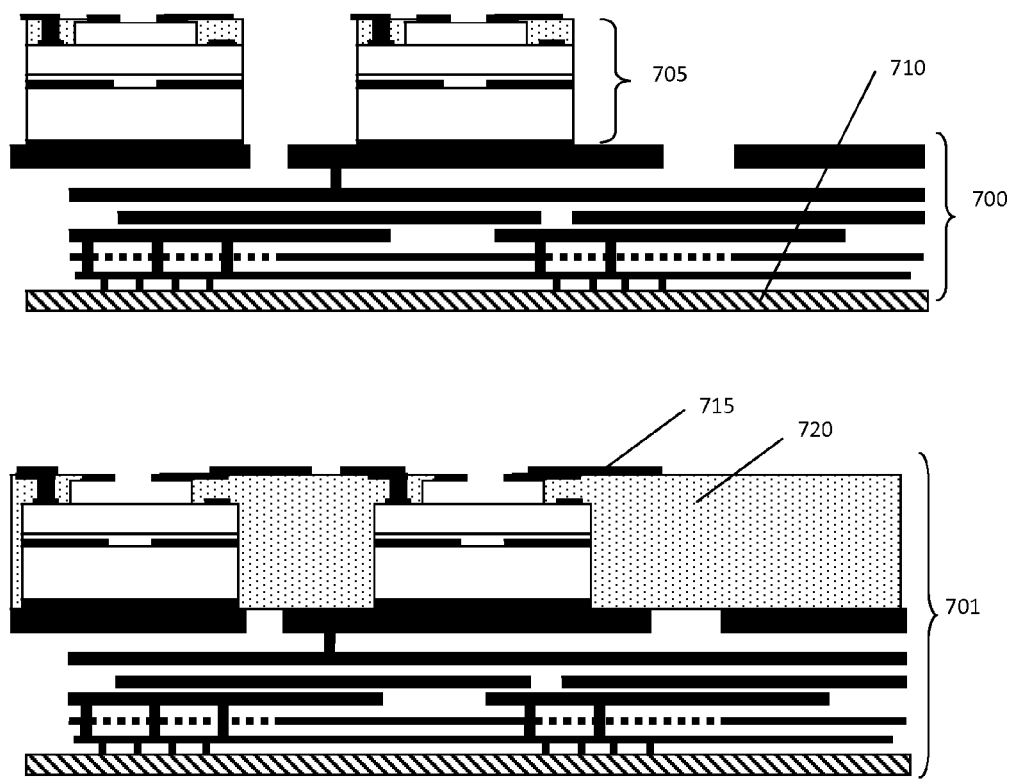
FIG. 7 Illustrates cross-sectional views of electro-optically modulated vertical cavity surface emitting lasers seated on the back-end metal interconnect layers of an integrated circuit, in accordance with embodiments of the invention.

In one embodiment as illustrated in FIG. 7 an EOM VCSEL (705) optical building block is placed directly upon and bonded to the top of an integrated circuit (700), that contains a high density of transistors in an underlying layer (710). This is optionally followed by the application of a surface planarizing material (720) such as a polyimide and the patterning of surface metal lines and interconnections (715) to the EOM VCSEL.

Figure 8:
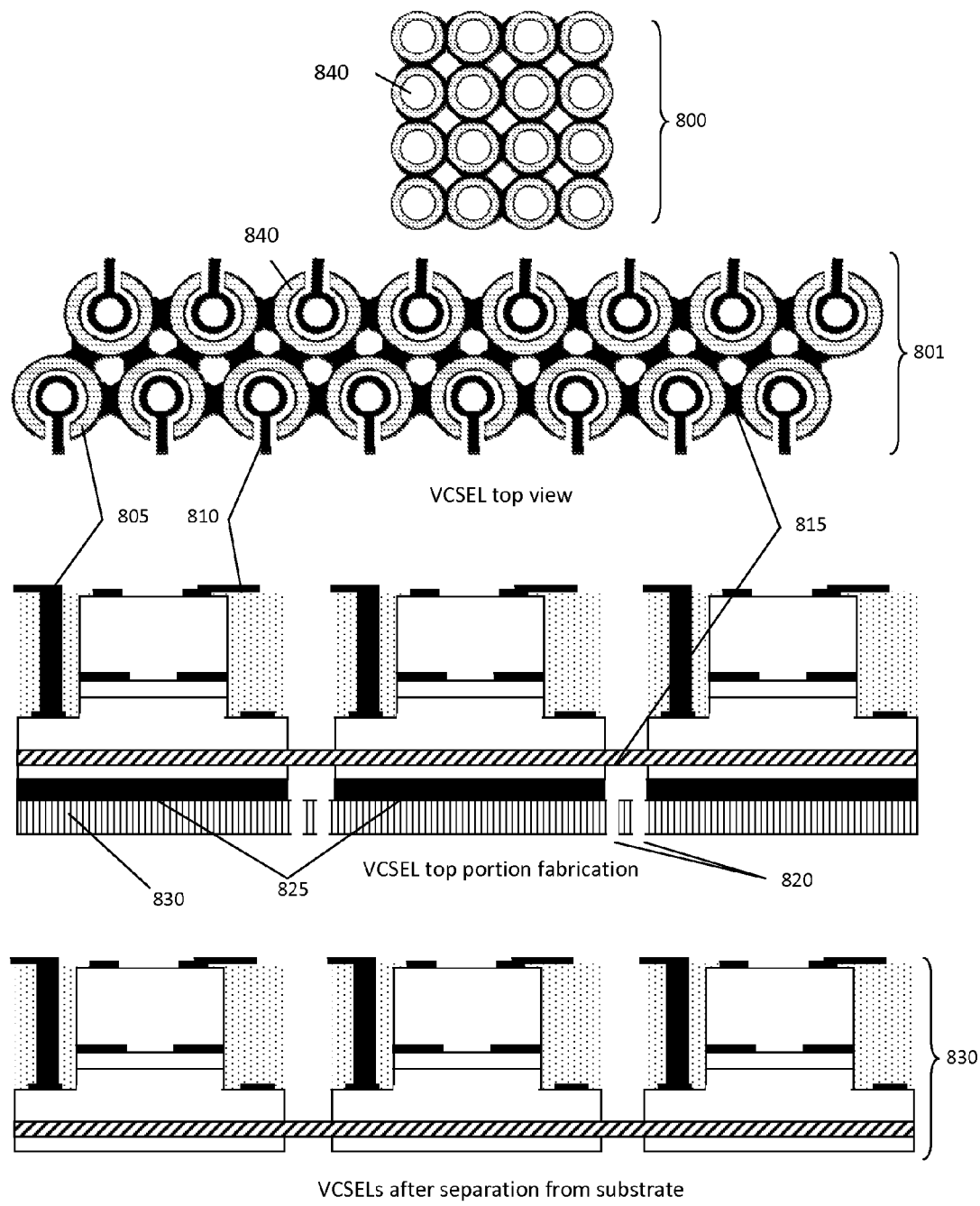
FIG. 8 Illustrates a top-down view and cross-sectional views of the fabrication and substrate separation of an interconnected plurality of interconnected VCSEL disks, in accordance with an embodiment of the invention.

FIG. 8 illustrates cross-sectional perspectives of the fabrication and substrate separation of an interconnected plurality of interconnected VCSEL disks (840) containing a sacrificial separation layer (825) and mother substrate (830) that are removed, in accordance with an embodiment of the invention. The VCSELs disks (840) remain physically interconnected after fabrication as a result of the planned incomplete dry etching of lower DBR material (815) due to an engineered etching proximity effect.

In one embodiment etch holes (820) are implemented to facilitate the selective etching of the sacrificial separation layer (825).

In one embodiment of the VCSEL disks (840), top metal contact layers (805) and (810) are utilized in a triangular geometrical layout (801), while those skilled in the relevant art will recognize that many other geometrical layouts are equally possible, including a square pattern (800) wherein one metal contact is placed on top for each individual VCSEL disk and the second metal contact is on the bottom of each interconnected VCSEL disk, as for metal layer (311) in FIG. 3.

Figure 9:
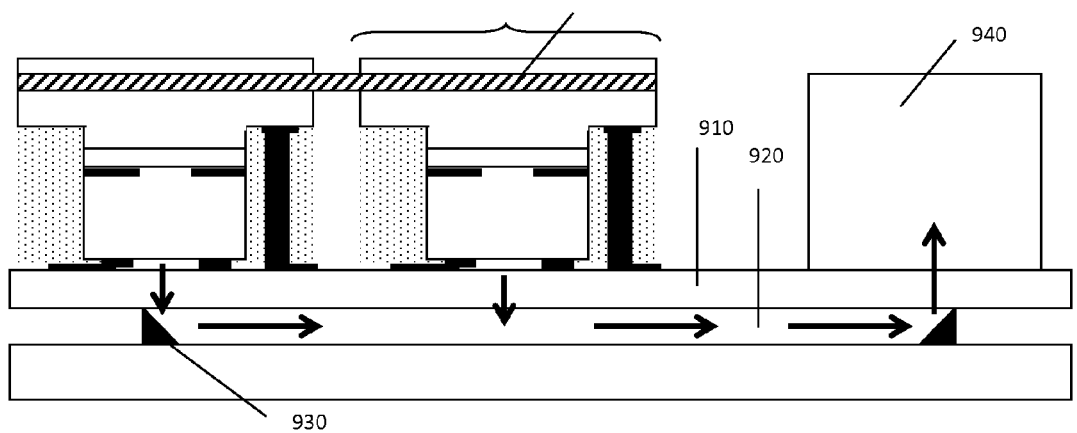
FIG. 9 is a cross-sectional perspective of an interconnected multitude of interconnected VCSEL disks seated on and bonded to an optical backplane, in accordance with an embodiment of the invention.

In one embodiment as illustrated in FIG. 9 an interconnected array of VCSEL disks (900) is placed on and bonded to an optical backplane or photonic integrated circuit (910), wherewith the VCSEL emission is directed down one of many possible waveguiding channels (920) that includes light directing elements, gratings, or similar light controlling structures (930) to another device such as one or more photodetectors (940).

In one embodiment the VCSEL disks in FIG. 9 are replaced with or fabricated next to arrays of photodetectors, that may or may not be physically interconnected.

Figure 10:
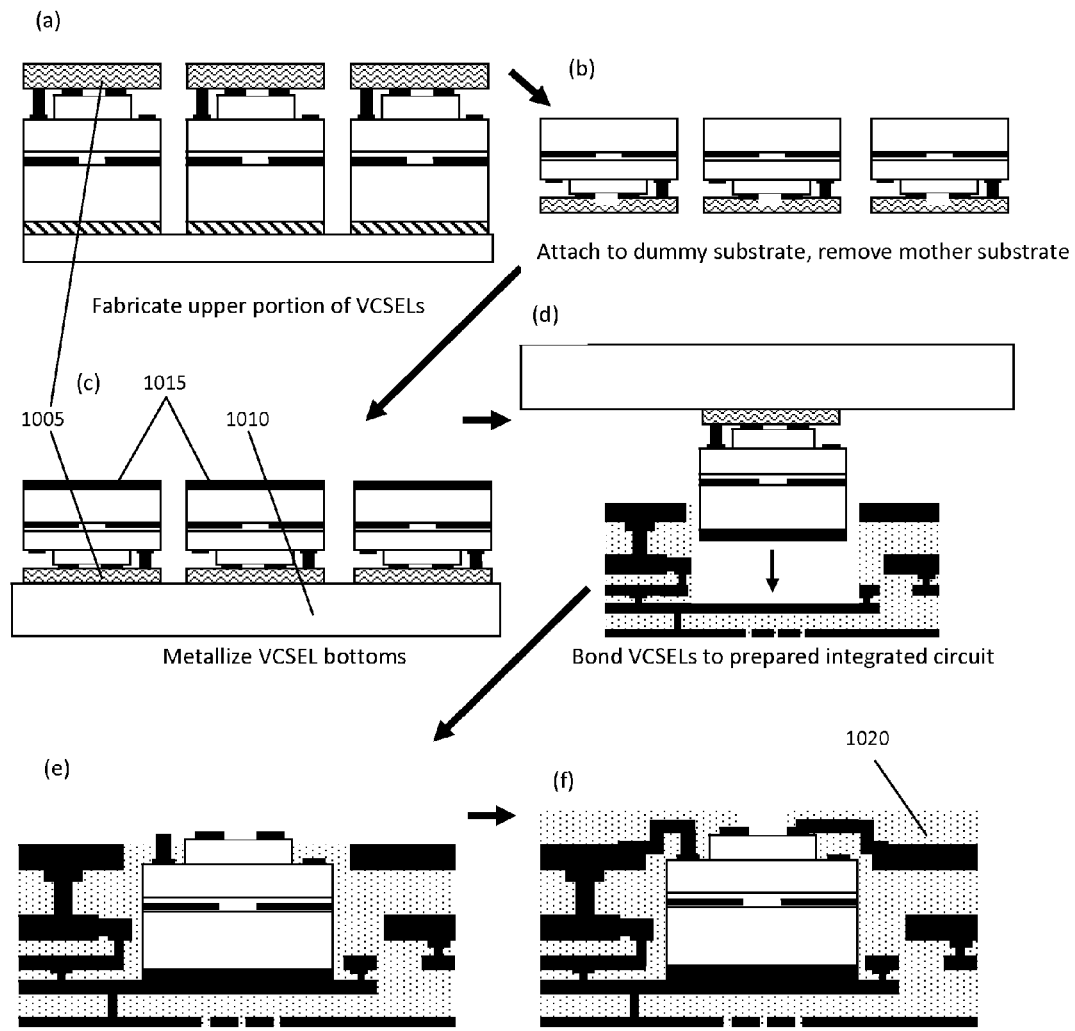
FIG. 10 is a flow chart illustrating a general method for the hybrid assembly of an integrated circuit with one or more EOM VCSEL disks, in accordance with an embodiment of the invention.

FIG. 10 contains a flow chart illustrating a general method for the hybrid assembly of an integrated circuit with one or more EOM VCSEL disks, in accordance with an embodiment of the invention. The upper layers of the EOM VCSELs are fabricated, planarized, and coated with a sacrificial material (1005) such as a layer of silicon nitride followed by a layer of silicon dioxide (FIG. 10a). The EOM VCSELs as grown on their mother wafer are then temporarily bonded to a dummy substrate (1010) made for example of fused quartz, a ceramic, or a semiconductor (FIG. 10b). The dummy substrate may also be coated with a thin sacrificial layer such as silicon dioxide. Next (FIG. 10c) the EOM VCSELs are separated from their mother substrate, followed by a bottom surface metallization (1015). Then, the EOM VCSELs are aligned to (FIG. 10d), seated within, and bonded to an integrated circuit (FIG. 10e). The final step (FIG. 10f) is to separate the EOM VCSELs from the dummy substrate and complete a top surface metal interconnection and passivation (1020) step.

Figure 11:
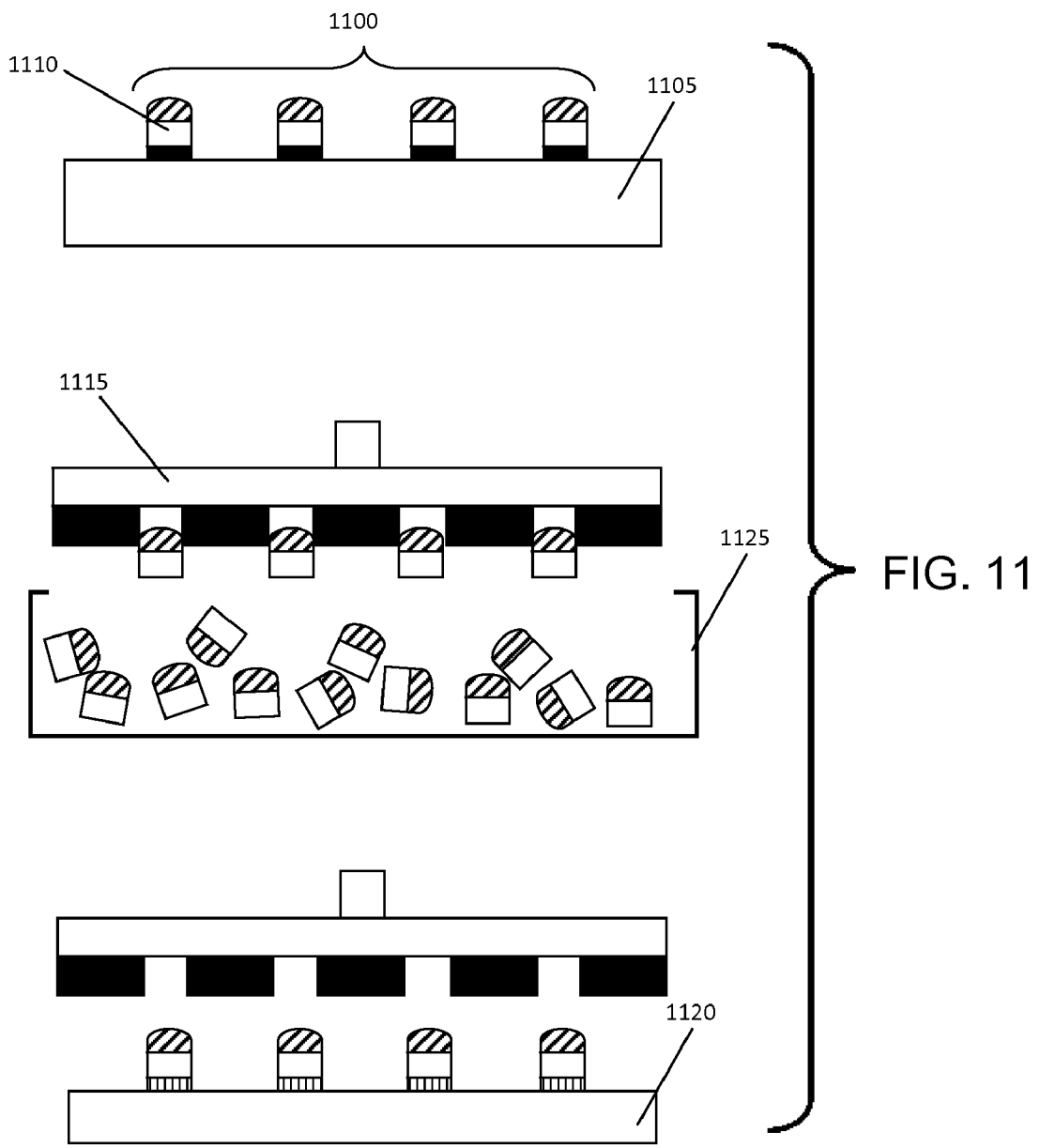
FIG. 11 is a flow chart of cross-sectional views illustrating a method of vertical cavity surface emitting laser transfer from a mother wafer to a foreign wafer using a vacuum tool, in accordance with an embodiment of the invention.

In one embodiment of the hybrid assembly method herein called VCSEL Disk Transfer as shown in FIG. 11, a multitude of lift-off VCSELs (1100) are first fabricated, separated from their mother substrate (1105), and stored in a holding chamber (1125). A vacuum is applied to a patterned vacuum tooling plate (1115) that then picks up individual VCSELs and precisely places them down on a foreign substrate (1120). The tooling plate is patterned with openings that correspond to the desired VCSEL disk positions on the new substrate or medium.

In one embodiment a dome (1110), lens, or other patterned structure is placed on top of the VCSELs before substrate removal to facilitate the vacuum sorting and collection process.

Figure 12:
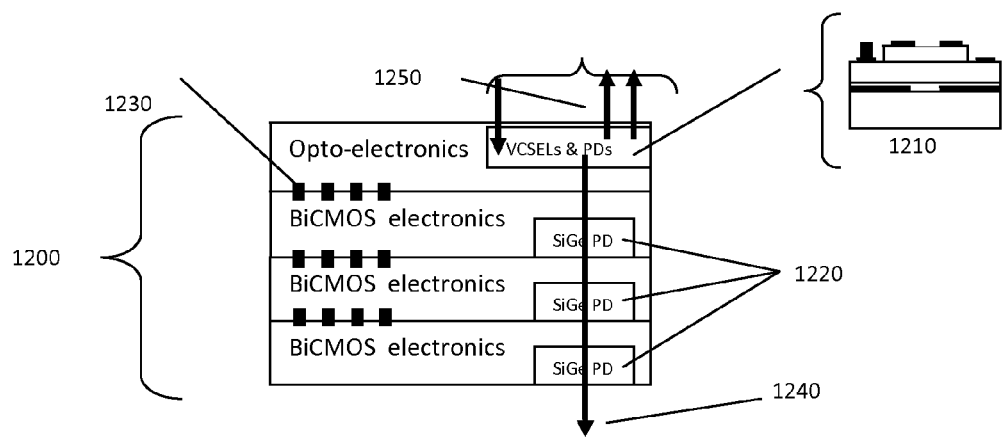
FIG. 12 is a cross-sectional perspective illustrating a three-dimensional stack of individually-processed layers containing any combination of CMOS circuits, BiCMOS circuits, VCSELs, RCLEDs, photonic waveguides or other photonic integrated circuits, or photodetectors, in accordance with an embodiment of the invention.

In one embodiment as illustrated in FIG. 12, wherein an assembled optoelectronic layer of VCSELs and CMOS integrated circuits is applied, a three-dimensional (3D) integrated systems is composed of individual layers that are individually produced and then assembled by stacking (1200), wherein each layer represents a microelectronic, photonic, optoelectronic, or other building block and the building blocks may be electrically (1230) and optically (1240) interconnected. One or more layers contain one or more VCSELs (1210) and/or other optoelectronic devices in any combination such as for example EOM VCSELs, VCSELs, EOM RCLEDs, RCLEDs and photodetectors. One or more of the stacked layers may include CMOS or BiCMOS or other integrated circuits that may contain semi-transparent photodetectors such that a light signal (1240) generated by a VCSEL or other transmitting device may be detected simultaneously by one or more photodetecting devices (1220). Light signals serving as optical interconnecting signals or sensing signals or probes or for other purposes may be sent on and off of the 3D stack (1250) for data communications, signal processing, sensing, or for other purposes.

In addition to assembly methods that transfer large numbers of devices such as VCSEL from one mother substrate onto another planar active or passive material layer, it is desirable to be able to transfer single devices from the mother substrate one at a time to selective locations on the accepting material layer. The following FIGS. 13 through 16 illustrate a wafer-level attachment method for the purpose of placing individual devices selectively on silicon-based integrated circuits or other foreign material layers.

Figure 13A:
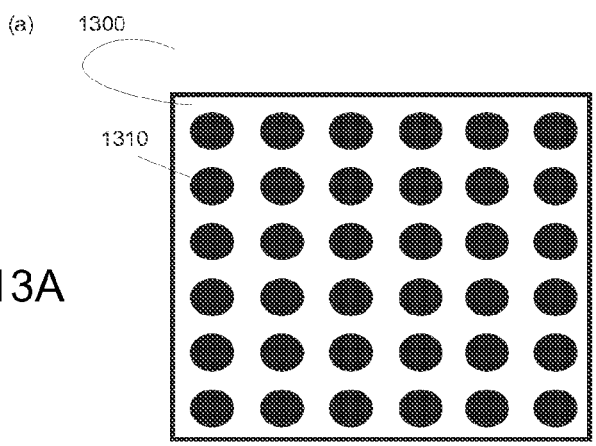
FIG. 13A is a view of an original wafer containing an array of optical components.
Figure 13B:
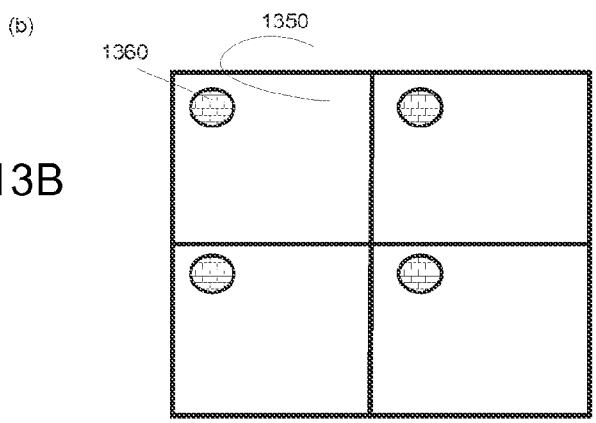
FIG. 13B is a view of a final IC wafer with positions for further attachments of the optical components.
Figure 14:
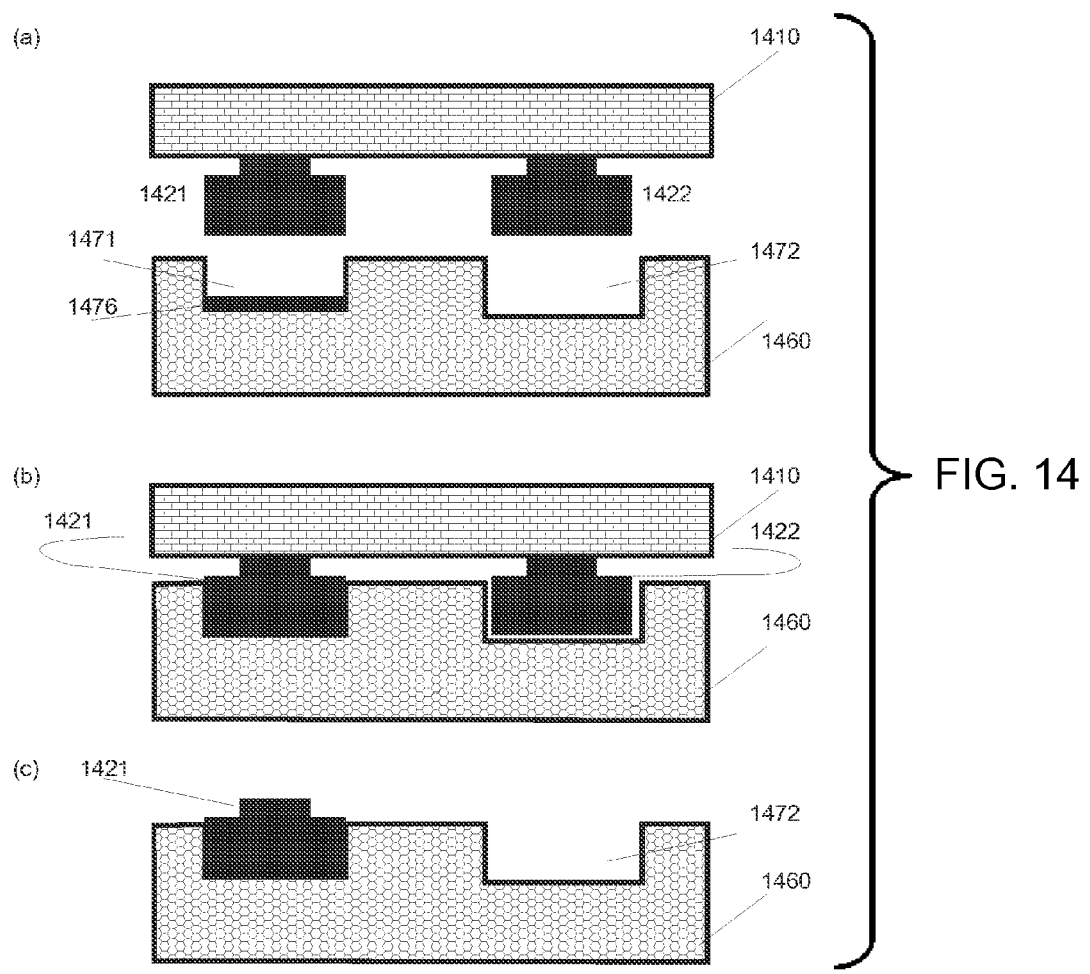
FIG. 14 Schematics of the process of the selective attachment of the optical components onto a foreign medium.

According to one aspect of the invention the optical components are processed on the wafer with the periodicity, shorter by an integer number than the periodicity of the port positions for these components on the silicon wafer. In this case, when the wafers are aligned and merged, some of the optical components on the wafer will match the port positions on the processed silicon-based wafer. This is schematically shown in FIGS. 13A and 13B. The mother wafer (1300) contains a high density of optical devices (1310). The final silicon wafer (1350) contains only a low density of ports for optical devices (1360).

According to one embodiment of the present invention, certain morphological modulations can be introduced in such a way that only a few optical components attached to the mother (or carrier) wafer can touch the surface of the silicon-based chip. This is shown in FIG. 14(a). The mother wafer (1410) contains a plurality of optical devices, two of which are shown, (1421) and (1422). The silicon-based wafer (1460) contains a plurality of voids, two of which are shown, (1471) and (1472). An additional layer (1476) renders the void (1471) shallower than the void (1472). FIG. 14(b) illustrates the next stage of the process, where the optical device (1421) attached to the silicon-based wafer (1460), whereas a gap remains between the optical device (1422) and the silicon-based wafer (1460). Those of skill in the art will appreciate that the attraction forces between the optical device (1421) and the silicon-based wafer (1460) can be made stronger than the attraction forces between the optical device (1421) and the mother wafer (1410). Then, at the next stage of the process, when the mother wafer (1410) is removed, the attached optical device (1421) remains attached to the wafer (1460).

A variety of similar approaches leading to the same result may be used. For example, pedestals of different height (and not voids of different depths) can be used for selective attachment. There may be combination of approaches and the optical components can be transferred with pedestals to the carrier wafer and with voids to the processed silicon wafer.

Figure 15:
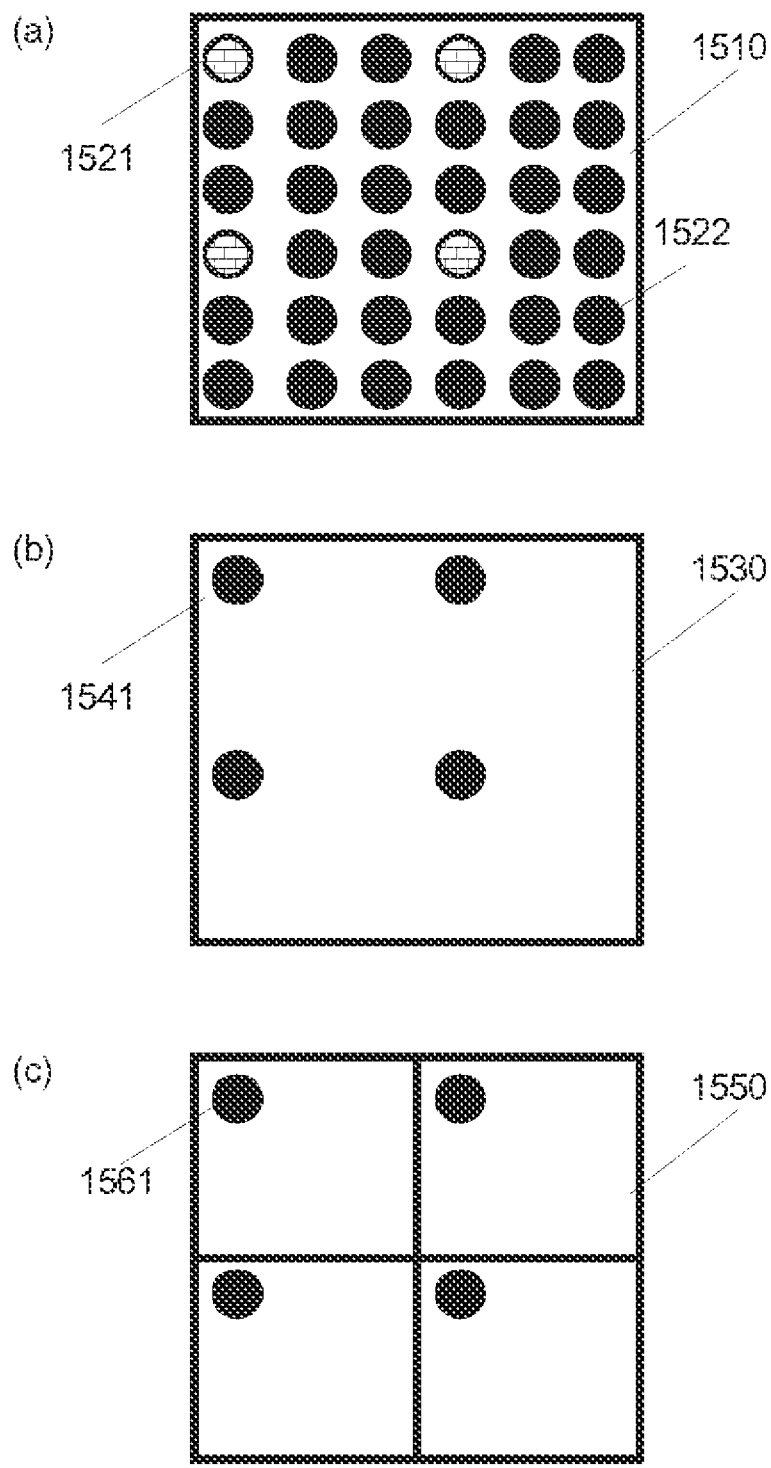
FIG. 15(a) Schematic view of the optical component wafer or carrier wafer with the optical components after the first attachment to the carrier wafer.
FIG. 15(b) The carrier wafer with optical components which fit to the ports positions on the processed silicon wafer.
FIG. 15(c) Optical components attached to the integrated circuits processed from the silicon wafer.
Figure 16:
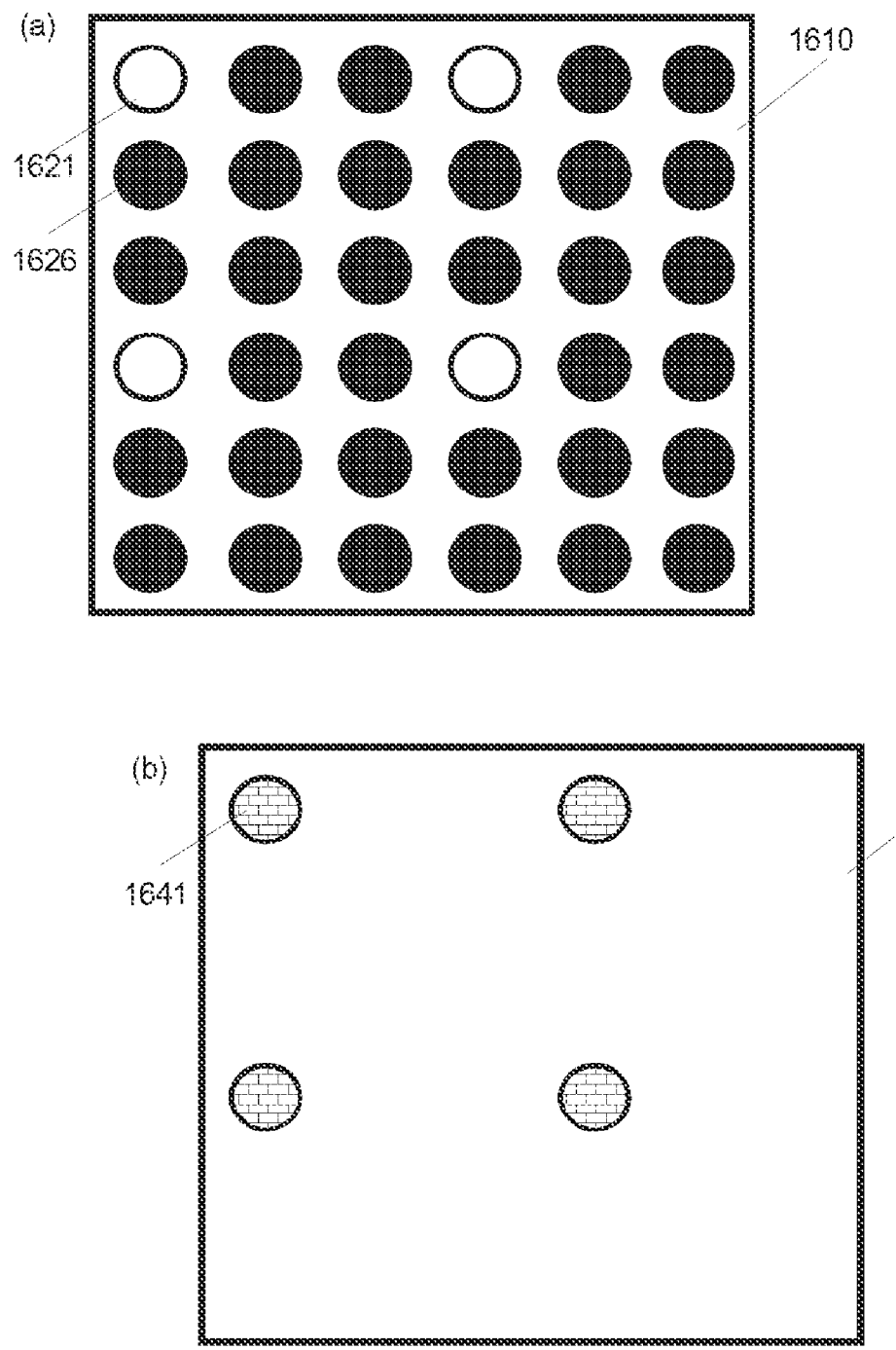
FIG. 16(a) Shifted part of the wafer with optical components after the first attachment.
FIG. 16(b) A new part of the processed silicon-based wafer with positions for the attachments of optical components.

Different particular sequences can be applied. An example is given in FIG. 15, where the components are selectively transferred to the carrier wafer, or transfer wafer, and then non-selectively to the processed silicon wafer. FIG. 15(a) shows a mother wafer (1510), wherein the optical devices (1521) need to be transferred, and the rest of the optical devices (1522) must stay on the mother wafer. The devices (1521) are selectively transferred to the carrier wafer (1530) and stay (1541) on the carrier wafer, as shown in FIG. 15(b). FIG. 15(c) shows the final silicon-based wafer (1550), onto which the optical devices are transferred (1561) non-selectively from the carrier wafer (1530). There can be more or fewer intermediate steps depending on the particular technology and optical components and processed silicon-based wafer design.

According to yet another aspect of the invention the process can be repeated with the next silicon wafer and the same wafer with optical components. In this case the next portion of the optical components is transferred to the next processed silicon based wafer, as it is shown in FIGS. 16(a) and 16(b), and the process can be repeated. FIG. 16(a) shows schematically the shifted wafer (1610) with optical devices after the first deposition, whereas the wafer contains optical devices (1626) and lacks those devices (1621) which were deposited in the first process. As the wafer with optical devices (1610) and the end silicon-based wafer (1630) are shifted, the ports (1641) for the deposition of the optical devices are aligned with the devices (1621) remaining on the wafer (1610). Thus, all the optical components of from the semiconductor wafer can be transferred resulting in an extremely material, energy and cost-effective technology. Assuming a characteristic side of the high-speed optical component of about 20 micrometers, the total number of the single devices produced from one 6-inch wafer is close to 45 million. Certainly multiple devices or arrays can be transferred to a single final chip. Furthermore, different optical components from different semiconductor wafers can be transferred to the same processed silicon-based wafer. Different height of the components and different depth of the voids, introduction of dummy pedestals and voids to limit the penetration depths and other approaches can be used to optimize the process.

The above description of illustrated embodiments of the invention, including what is described in the Abstract, is not intended to be exhaustive or to limit the invention to the precise forms disclosed. While specific embodiments of, and examples for, the invention are described herein for illustrative purposes various modifications are possible within the scope of the invention, as those skilled in the art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation. Certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the features set out in the appended claims.

The above description of the background art makes reference to the following publications that are pertinent with regard to the technological aspects underlying the instant invention:

1. E. Mohammed et al., Optical Interconnect System Integration for Ultra-Short-Reach Applications" Intel Technology Journal, Volume 08 Issue 02 (2004) pp. 115-127.
2. E. Yablonovich et al., "Extreme Selectivity in the Lift-Off of Epitaxial GaAs Films", Applied Physics Letters 51 (26), pp. 2222-2224 (1987).
3. J. J. Talghader, "Integration of LEDs and VCSELs Using Fluidic Self-Assembly", Proceedings SPIE 3286 Photonics West 1998, San Jose, Calif., pp. 86-95 (January 1998).
4. J. A. Lott et al., "Tunable Red Vertical Cavity Surface Emitting Lasers Using Flexible Micro-Electro-Mechanical Top Mirrors", Proceedings IEEE LEOS Optical MEMS 2000, Poipu Beach, Hawai'i (20-24 Aug. 2000).
5. J. A. Lott, "Fabrication and Applications of Lift-Off Vertical Cavity Surface Emitting Laser (VCSEL) Disks", Invited Talk, Proceedings SPIE 4649-31 Photonics West 2002, San Jose, Calif., pp. 203-210 (20-25 Jan. 2002).
6. J. A. Lott et al., "Interconnected Lift-Off VCSELs for Microcavity Device Arrays", Proceedings IEEE LEOS Summer Topicals: VCSEL and Microcavity Lasers, Mont Tremblant, Canada, pp. 11-12 (15-17 Jul. 2002).
7. D. G. Deppe et al., "AlGaAs—GaAs Vertical-Cavity Surface-Emitting Lasers grown on Silicon Substrates", Applied Physics Letters 56 (8), pp. 740-742 (19 Feb. 1990).
8. T. Egawa et al, "Low-Temperature Continuous-Wave Operation of AlGaAs—GaAs Vertical-Cavity Surface-Emitting Lasers on Silicon Substrates", IEEE Photonics Technology Letters, 9 (7), pp. 872-874 (July 1997).
9. C. Jung et al, "64 Channel Flip-Chip Mounted Selectively Oxidized GaAs VCSEL Array for Parallel Optical Interconnects", Proceedings SPIE 3627 Photonics West 1999, San Jose, Calif., pp. 143-151 (January 1999).
10. D. A. Louderback et al, "Flip-Chip Bonded Arrays of Monolithically Integrated Microlensed Vertical-Cavity Surface-Emitting Lasers and resonant Photodetectors", IEEE Photonics Technology Letters, 11 (3), pp. 304-306 (March 1999).

11. R. Pu et al., "Thermal Resistance of VCSEL's Bonded to Integrated Cicuits", IEEE Photonics Technology Letters, 11 (12), pp. 1554-1556 (December 1999).

12. K. D. Choquette et al., "Short Wavelength bottom-emitting Vertical Cavity Lasers Fabricated using Wafer Bonding", IEE Electronics Letters, 34 (14), pp. 1404-1405 (9 Jul. 1998).

13. Y. Xiong et al., "Oxide-Defined GaAs Vertical-Cavity Surface-Emitting Lasers on Si Substrates", IEEE Photonics Technology Letters, 12 (2), pp. 110-112 (February 2000).

14. C. K. Lin et al., "Uniform Wafer-Bonded Oxide-Confined Bottom-Emitting VCSEL Arrays on Sapphire Substrates", IEEE Photonics Technology Letters, 13 (4), pp. 263-265 (April 2001).

The invention claimed is:

1. A process of positioning optical components on a silicon-based wafer, comprising:
   providing an original semiconductor wafer with a plurality of optical components, the original wafer including a removable layer;
   transferring one or more of the optical components from the original wafer by selective oxidation followed by selective etching;
   placing the one or more optical components onto a surface of a processed silicon-based wafer;
   attaching at least one of the optical components at a predetermined position on the silicon-based wafer, and retaining at least one of the optical components on the original wafer.

2. The process according to claim 1, which further comprises following with one or a plurality of further attachment processes, and thereby attaching the components from the original wafer step-by-step to one or a plurality of the silicon-based wafers.

3. The process according to claim 1, which comprises using at least one intermediate wafer for attachment.

4. The process according to claim 3, which comprises, following a selective attachment of the optical components from the original wafer onto a surface of the at least one intermediate wafer with a non-selective attachment of the optical components from the at least one intermediate wafer onto a surface of the silicon-based wafer.

5. The process according to claim 3, which comprises, following a non-selective attachment of the optical components from the original wafer onto a surface of the at least one intermediate wafer with a selective attachment of the optical components from the at least one intermediate wafer onto a surface of the silicon-based wafer.

6. The process according to claim 1, which comprises selecting at least one of the optical components from the group consisting of:
   a) vertical cavity surface-emitting laser;
   b) resonant cavity light emitting diode;
   c) electrooptically-modulated vertical cavity surface-emitting laser; and
   d) electrooptically-modulated resonant cavity light-emitting diode;
   e) photodetector;
   f) modulator;
   g) optical filter; and
   h) phototransistor.

7. The process according to claim 1, wherein a lateral period of a positioning of the devices on a silicon-based wafer equals an integer number times a period of the optical components on the initial semiconductor wafer.

8. The process according to claim 1, which comprises attaching the optical components to a carrier wafer by a processing technique selected from the group consisting of adhesion, welding, and gluing.

9. The process according to claim 8, which comprises detaching the optical devices from the carrier wafer by decomposing the adhesive material or the glue or mechanically detaching by forming a stronger attachment to the processed silicon wafer or to another carrier wafer.

10. The process according to claim 1, which comprises providing voids of different depths for selective attachment.

11. The process according to claim 1, which comprises providing pedestals of different heights for selective attachments.

12. The process according to claim 1, wherein the at least one optical component comprises a semiconductor die including:
   a lower DBR mirror and an upper DBR mirror;
   a layer selected from the group consisting of a sacrificial layer and a separation layer disposed between a substrate and the lower DBR mirror;
   a microcavity active region disposed between the lower and upper DBR mirrors; and
   gain elements disposed within the microcavity to generate optical electro-magnetic radiation for lasing;
   the semiconductor die all together forming a two-electrode VCSEL diode structure with the added sacrificial layer.

13. The process according to claim 12, wherein the sacrificial layer or separation layer is composed of a material selected from the group consisting of AlAs, AlGaAs, InGaAs, InGaP, AlGaP, AlGaInP, or other semiconductor or selectively oxidized semiconductor such as AlAs or AlGaAs converted to AlO or AlGaAO, respectively, or other applied sacrificial material layer.

14. The process according to claim 13, which comprises forming the semiconductor die with one or more optional etch stop layers within the VCSEL to facilitate a precise stopping of an etching process so as to expose a particular layer for metal placement or another processing step.

15. The process according to claim 14, wherein the semiconductor die further comprises one or more optional AlAs or AlGaAs layers anywhere within the device structure for forming an AlO or AlGaO current blocking and/or optical mode waveguiding aperture.

16. The process according to claim 15, wherein the microcavity active region contains one or more sets or sheets of quantum confinement or gain structures.

17. The process according to claim 16, wherein the microcavity active region contains at least one of quantum wells and quantum dots.

18. The process according to claim 16, which comprises forming the semiconductor die as a VCSEL, and modifying the VCSEL in selected regions of the device by way of one or more ion implantation steps.

19. The process according to claim 18, which comprises introducing ionized hydrogen (protons) or oxygen.

20. The process according to claim 16, wherein the optical component is an electrooptically modulated VCSEL (EOM VCSEL).

21. The process according to claim 20, which comprises forming an array of interconnected VCSELs by way of an etching proximity effect to form a resulting building block of optical devices suitable for placement on, transfer to, and/or integration with a foreign substrate, circuit, or other medium.

22. The process according to claim 20, which comprises forming an array of interconnected EOM VCSELs by way of an etching proximity effect to thereby form a building block of optical devices suitable for placement on, transfer to, and/or integration with a foreign substrate, circuit, or other medium.

23. The process according to claim 20, wherein the optical devices are epitaxially-grown optoelectronic devices or combinations of these devices containing sacrificial, separation, and/or etch stop layers.

24. The process according to claim 23, wherein the optical devices are optical filters, modulators, photodetectors, resonant cavity light emitting diodes, edge-emitting laser diodes, or phototransistors.

25. The process according to claim 1, wherein a plurality of optical devices separated from a mother substrate thereof are placed, bonded, seated, heat sunk, and or electrically-bonded to and/or integrated with a foreign medium, and the foreign medium is selected from the group consisting of:
   a foreign substrate,
   a circuit,
   an integrated circuit, and
   an optical backplane.

26. The process according to claim 25, which comprises placing one or more blocks of transferred optical devices directly upon and bonding with, fusing to, and electrically connecting with another block of transferred devices, and optionally repeating these steps to form a plurality of stacked layers of devices.

27. A VCSEL disk transfer method for processing and hybrid assembly of semiconductor dies according to claim 25, which further comprises collecting a plurality of VCSELs with a vacuum tooling plate and placing the VCSELs onto a new substrate or other foreign medium with the vacuum tooling plate.

28. The method of claim 27, which comprises providing a vacuum tooling plate made by micro-electro-mechanical systems fabrication techniques or other microfabrication technique.

29. The process according to claim 1, wherein the step of transferring one or more of the optical components from the original wafer by selective oxidation followed by selective etching results in transferring one or more of the optical components from the original wafer to an intermediate carrier, the intermediate carrier having at least one position corresponding to the predetermined position on the silicon-based wafer; and
   wherein the step of placing one or more optical components onto the surface of the processed silicon-based wafer comprises transferring one or more of the optical components directly from the intermediate carrier to the silicon-based wafer.

30. The process according to claim 29, which comprises repeating the attaching step to thereby attach the optical components step-by-step to one or a plurality of silicon-based wafers.

31. The process according to claim 29, wherein the intermediate carrier is a transfer wafer and the method comprises: producing the plurality of optical components on a semiconductor wafer and providing a separation layer between the semiconductor wafer and the optical components; after transferring the optical components to the transfer wafer, eliminating the separation layer and detaching the optical components from the semiconductor wafer.

* * * * *